(12) United States Patent
Zhang et al.

(10) Patent No.: US 8,829,921 B2
(45) Date of Patent: Sep. 9, 2014

(54) ALTERNATING CURRENT VOLTAGE DETECTION CIRCUIT

(75) Inventors: Jun Zhang, Shenzhen (CN); Jun-Wei Zhang, Shenzhen (CN); Tsung-Jen Chuang, New Taipei (TW); Shih-Fang Wong, New Taipei (TW)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 326 days.

(21) Appl. No.: 13/221,921

(22) Filed: Aug. 31, 2011

(65) Prior Publication Data

US 2012/0293161 A1    Nov. 22, 2012

(30) Foreign Application Priority Data

May 18, 2011 (CN) .......................... 2011 1 0129118

(51) Int. Cl.
*G01R 27/02* (2006.01)
*G01R 31/02* (2006.01)
*G01R 1/38* (2006.01)

(52) U.S. Cl.
USPC ........................... 324/607; 324/72.5; 324/115

(58) Field of Classification Search
None
See application file for complete search history.

(56) References Cited

U.S. PATENT DOCUMENTS

| 5,757,275 A * | 5/1998 | Mowry, Jr. ................... 340/664 |
| 7,391,169 B2 * | 6/2008 | Huang et al. .................. 315/291 |
| 2006/0104096 A1 * | 5/2006 | Alfano ............................ 363/40 |
| 2010/0141170 A1 * | 6/2010 | Yu et al. ....................... 315/291 |

* cited by examiner

*Primary Examiner* — Melissa Koval
*Assistant Examiner* — Courtney McDonnough
(74) *Attorney, Agent, or Firm* — Novak Druce Connolly Bove + Quigg LLP

(57) ABSTRACT

An AC voltage detection circuit includes a conversion module, a comparison module, and a prompt module. The conversion module connects to an AC power source and converts the AC voltage provided by the AC power source to an AC current, and then converts the AC current to a direct current (DC) voltage reflecting the AC voltage. The comparison module is connected to the conversion module, and compares the DC voltage with a first predetermined voltage and a second lesser predetermined voltage, and produces a control signal when the DC voltage is greater than the first predetermined voltage or less than the second predetermined voltage. The prompt module produces a prompt signal when receiving the control signal.

7 Claims, 2 Drawing Sheets

ALTERNATING CURRENT VOLTAGE DETECTION CIRCUIT

BACKGROUND

1. Technical Field

The present disclosure relates to voltage detection circuits, particularly, to an alternating current voltage detection circuit.

2. Description of Related Art

Home appliances are generally powered by Alternating Current (AC) power source, and if the power supplied to the home appliance is unstable, the home appliance may be damaged. Therefore, it is necessary to detect and examine the voltage of the AC power supplied to home appliances and provide a prompt if the characteristics of the voltage is abnormal.

Therefore, it is desirable to provide an AC voltage detection circuit to overcome the described limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail, with reference to the accompanying drawings.

Figure 1:
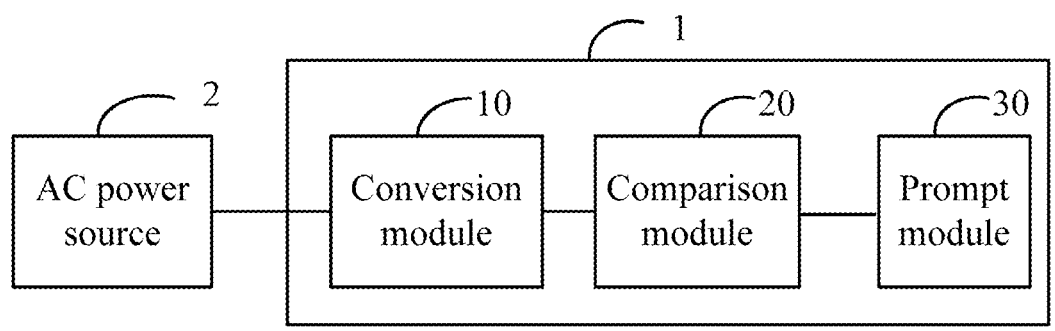
FIG. 1 is a block diagram of an alternating current voltage detection circuit, in accordance with an exemplary embodiment.

Referring to FIG. 1, an alternating current (AC) voltage detection circuit 1 includes a conversion module 10, a comparison module 20, and a prompt module 30. The conversion module 10 connects to an AC power source 2 and converts the AC voltage provided by the AC power source 2 to an AC current, and then converts the AC current to a direct current (DC) voltage. In the embodiment, the AC voltage and the AC current have a first fixed relationship, the AC current and the DC voltage have a second fixed relationship, accordingly, the DC voltage is related to the AC voltage and reflects the AC voltage. The comparison module 20 compares the DC voltage with a first predetermined voltage and a second predetermined voltage, and produces a control signal when the DC voltage is either greater than the first predetermined voltage or less than the second predetermined voltage, where the second predetermined voltage is less than the first predetermined voltage. In the embodiment, the first predetermined voltage reflects the maximum allowable value of the AC voltage provided for home appliances (not shown), the second predetermined voltage reflects the minimum allowable value of the AC voltage provided for home appliances, and the first predetermined voltage and the second predetermined voltage can be set by the user as defining the allowable range. The prompt module 30 produces a prompt signal when receiving the control signal from the comparison module 20, that is, the prompt module 30 produces the prompt signal when, according to the comparison module 20, the AC voltage provided by the power source 2 is out of the allowed range.

Figure 2:
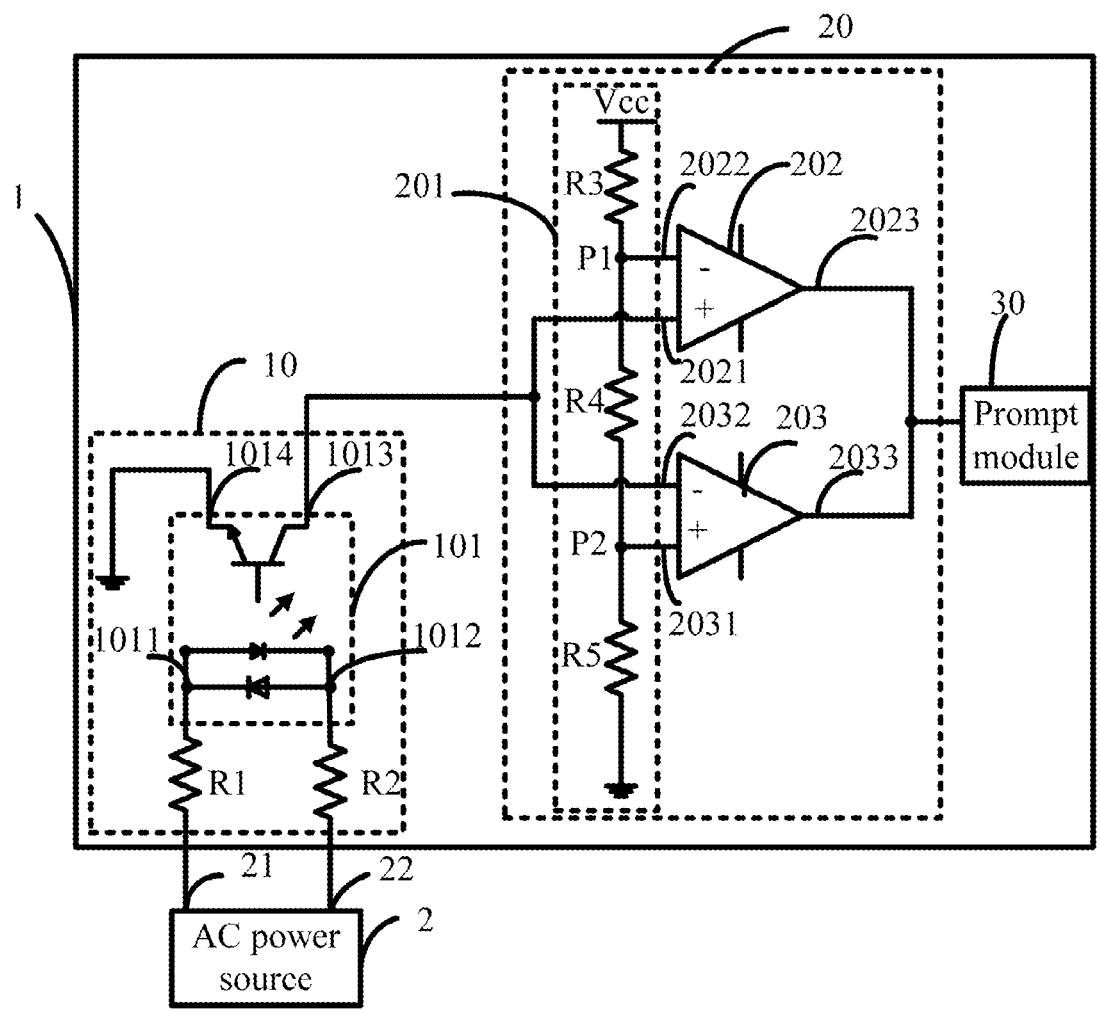
FIG. 2 is a circuit diagram of the alternating current voltage detection circuit of FIG. 1, in accordance with an exemplary embodiment.

Referring to FIG. 2, in the embodiment, the conversion module 10 includes resistors R1, R2, and an optical coupler 101. The optical coupler 101 includes a first input terminal 1011, a second input terminal 1012, a first output terminal 1013, and a second output terminal 1014. The first input terminal 1011 is connected to an output terminal 21 of the AC power source 2 via the resistor R1, the second input terminal 1012 is connected to another output terminal 22 of the AC power source 2 via the resistor R2. The first output terminal 1013 is connected to the comparison module 20, and the second output terminal 1014 is grounded. In the embodiment, the conversion module 10 can be a two-pin plug which is plugged into a power socket to connect to the AC power source 2.

In the embodiment, the optical coupler 101 is a bi-directional switch, that is to say, the optical coupler 101 continues to transmit its signal when the direction of the current flowing through the first input terminal 1011 and the second input terminal 1012 is reversed and reversed again by the AC power source 2. Suppose that the AC voltage is Vs and the resistance values of the resistors R1 and R2 respectively are R1 and R2, then the amount of current flowing through the first input terminal 1011 and the second input terminal 1012 is Vs/(R1+R2). The resistance values of the resistors R1 and R2 are constant, therefore the amount of current flowing through the first input terminal 1011 and the second input terminal 1012 is linearly related to the AC voltage. The current flowing through the first input terminal 1011 and the second input terminal 1012 is the AC current converted by the conversion module 10, and the AC current and the AC voltage have the first relationship.

Suppose that the AC current flowing from the first input terminal 1011 to the second input terminal 1012 is a first current, then when the optical coupler 101 is turned on, there is a second current flowing from the first output terminal 1013 to the second output terminal 1014. The second current is related to the first current, and the voltage of the first output terminal 1013 is determined by the second current, thus the voltage of the first output terminal 1013 is related to the first current, and further related to the AC voltage. In the embodiment, the voltage of the first output terminal 1013 is the DC voltage converted by the conversion module 10, and the voltage of the first output terminal 1013 is related to the AC voltage of the AC power source 2, and reflects the AC voltage.

The comparison module 20 includes a predetermined voltage setting circuit 201, a first comparator 202, and a second comparator 203. The predetermined voltage setting circuit 201 includes a voltage port Vcc, and resistors R3, R4, and R5. The resistors R3, R4, and R5 are connected between the voltage port Vcc and ground in series. The voltage port Vcc is at a high voltage, for example, 5 volts. A connection point between the resistors R3 and R4 constitutes a first predetermined voltage port P1 and produces the first predetermined voltage, and a connection point between the resistors R4 and R5 constitutes a second predetermined voltage port P2 and produces the second predetermined voltage. The first predetermined voltage produced by the first predetermined voltage port P1 is Vcc*(R4+R5)/(R3+R4+R5), and the second predetermined voltage produced by the second predetermined voltage port P2 is Vcc*R5/(R3+R4+R5).

The first comparator 202 includes a non-inverting input port 2021, an inverting input port 2022, and an output port 2023. The non-inverting input port 2021 is connected to the first output terminal 1013 of the optical coupler 101, the inverting input port 2022 is connected to the first predetermined voltage port P1, and the output port 2023 is connected to the prompt module 30.

The second comparator 203 also includes a non-inverting input port 2031, an inverting input port 2032, and an output port 2033. The non-inverting input port 2031 is connected to the second predetermined voltage port P2, the inverting input port 2032 is connected to the first output terminal 1013 of the optical coupler 101, and the output port 2033 is connected to the prompt module 30.

The first comparator 202 produces a high voltage control signal when it determines that the voltage of the first output terminal 1013 is greater than the first predetermined voltage, the second comparator 203 also produces a high voltage control signal when it determines that the voltage of the first output terminal 1013 is smaller than the second predetermined voltage. The prompt module 30 produces a prompt signal when it receives the high voltage control signal either from the first comparator 202 or from the second comparator 203. In this way the prompt module 30 produces a prompt signal whenever the AC voltage is out of the allowable range.

In the embodiment, the prompt module 30 can be an LED circuit capable of controlling the LED to light when receiving the control signal. In other embodiments, the prompt module 30 can be an audio circuit capable of producing audio signals when receiving the control signal.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. An AC voltage detection circuit comprising:
   a conversion module, configured for being connecting to an AC power source and converting an AC voltage provided by the AC power source into an AC current, and then converting the AC current into a direct current (DC) voltage reflecting the AC voltage; wherein the conversion module comprises a first resistor, a second resistor, and an optical coupler, the optical coupler comprises a first input terminal, a second input terminal, a first output terminal, and a second output terminal; the first input terminal is connected to one output terminal of the AC power source via the first resistor, the second input terminal is connected to another output terminal of the AC power source via the second resistor, the first output terminal is connected to the comparison module, the second output terminal is grounded;
   a comparison module connected to the conversion module, configured for comparing the DC voltage with a first predetermined voltage and a second predetermined voltage less than the first predetermined voltage, respectively, and producing a control signal when it determines that the DC voltage is either greater than the first predetermined voltage or less than the second predetermined voltage; and
   a prompt module, configured for producing a prompt signal when receiving the control signal.

2. The AC voltage detection circuit according to claim 1, wherein the optical coupler is a bi-directional switch, a first current flowing through the first input terminal and the second input terminal is linearly related to the AC voltage, when the optical coupler is turned on, a second current flowing through the first output terminal and the second output terminal is linearly related to the first current, and a voltage of the first output terminal is determined by the second current, thus the voltage of the first output terminal is related to the first current, and is further related to the AC voltage.

3. The AC voltage detection circuit according to claim 2, wherein the comparison module comprises a predetermined voltage setting circuit, a first comparator, and a second comparator, the predetermined voltage setting circuit comprises a voltage port, and a third resistor, a fourth resistor, and a fifth resistor which are connected between the voltage port and ground in series, a connection point between the third resistor and the fourth resistor constitutes a first predetermined voltage port and produces the first predetermined voltage, and a connection point between the fourth resistor and the fifth resistor constitutes a second predetermined voltage port and produces the second predetermined voltage.

4. The AC voltage detection circuit according to claim 3, wherein the first comparator and the second comparator both comprises a non-inverting input port, an inverting input port, and an output port, the non-inverting input port of the first comparator is connected to the first output terminal of the optical coupler, the inverting input port of the first comparator is connected to the first predetermined voltage port; the non-inverting input port of the second comparator is connected to the second predetermined voltage port, the inverting input port of the second comparator is connected to the first output terminal of the optical coupler, and the output ports of the first comparator and the second comparator are both connected to the prompt module.

5. The AC voltage detection circuit according to claim 4, wherein the first comparator produces a high voltage control signal when it determines that the voltage of the first output terminal is greater than the first predetermined voltage, the second comparator also produces the high voltage control signal when it determines that the voltage of the first output terminal is smaller than the second predetermined voltage; the prompt module produces the prompt signal when receiving the high voltage control signal from the first comparator or the second comparator.

6. The AC voltage detection circuit according to claim 5, wherein the prompt module is an LED circuit capable of controlling the LED to light when receiving the control signal.

7. The AC voltage detection circuit according to claim 5, wherein the prompt module is an audio circuit capable of producing audio signals when receiving the control signal.

* * * * *